United States Patent

Ohhinata et al.

[11] 4,039,863
[45] Aug. 2, 1977

[54] LIGHT ACTIVATED SEMICONDUCTOR SWITCH DEVICE

[75] Inventors: Ichiro Ohhinata, Yokohama; Shinzi Okuhara, Fujisawa; Michio Tokunaga, Zushi, all of Japan

[73] Assignee: Hitachi, Ltd., Japan

[21] Appl. No.: 590,562

[22] Filed: June 26, 1975

[30] Foreign Application Priority Data

July 19, 1974 Japan .................................. 49-82186

[51] Int. Cl.² ............................................. H03K 17/72
[52] U.S. Cl. .......................... 307/252 A; 307/252 G; 307/305; 307/311
[58] Field of Search .............. 307/252 A, 252 G, 202, 307/299, 305, 311; 323/225 C

[56] References Cited

U.S. PATENT DOCUMENTS 3,714,443  1/1973  Ogawa .............................. 307/252 A Primary Examiner—John Zazworsky
Attorney, Agent, or Firm—Craig & Antonelli

[57] ABSTRACT

A light activated semiconductor switch device comprising a light activated PNPN switch, an impedance element, a switching element, and a capacitance element. The impedance element and switching element are connected in parallel across the cathode gate and the cathode or across the anode and the anode gate of the light activated PNPN switch, and the switching element is turned on by the current supplied through the capacitance element, so that the device can operate with improved tolerance to $dv/dt$ and high turn-on sensitivity.

22 Claims, 12 Drawing Figures

LIGHT ACTIVATED SEMICONDUCTOR SWITCH DEVICE

This invention relates to improvements in light activated semiconductor switch devices of PNPN structure, and more particularly to a switch device of the kind above described which can operate with improved tolerance to $dv/dt$ and can be turned on with high sensitivity.

Light activated semiconductor switches of PNPN structure (referred to hereinafter as light activated PNPN switches) include a light activated diode switch provided merely with an anode and a cathode, a light activated SCR (LASCR) provided with a cathode gate in addition to the anode and cathode, and a light activated SCS (LASCS) provided with an anode gate in addition to the anode, cathode and cathode gate. These light activated PNPN switches have such commonly known advantages of conventional PNPN switches that they can control a high voltage and current, they can hold themselves and they have a high blocking voltage level in the forward and reverse directions. In addition to the above advantages, the light activated PNPN switches have such a great advantage that the gate trigger circuit can be electrically isolated from the main circuit. Thus, these light activated PNPN switches are employed in a variety of control circuits. For example, these light activated PNPN switches are used to constitute a cross-point switch for speech path in which the light activated PNPN switches are connected in parallel with each other in opposite polarity so that a ringing signal can also pass therethrough. When conventional PNPN switches are used to constitute such cross point switch for speech path, gate control current will flow into the main circuit since the gate trigger circuit is not electrically isolated from the main circuit. Thus, in a circuit in which such cross-point switches for speech path are connected in multiple, this gate control current will be successively accumulated to provide a value which is too large to be neglected. Further, a phase difference is produced between the current waveform and the voltage waveform since the switch acts as a capacitive load when a ringing signal passes therethrough. In a situation in which the current level is lower than the holding current level and the switch may be turned off unless the gate current is supplied, the voltage at the cathode may have a high level nearly equal to the peak value of the amplitude of the ringing signal. It is therefore necessary to prepare a voltage higher than the peak value of the ringing signal for the gate trigger circuit supplying the gate current to the switch.

In contradistinction, employment of the light activated PNPN switch for this application is very advantageous for solving the problems pointed out above due to the fact that the gate trigger circuit can be electrically isolated from the main circuit. However, the light activated PNPN switch has the defect similar to that of the conventional PNPN switch in that it may be erroneously turned on in response to the application of an abrupt voltage variation $dv/dt$ across the anode and the cathode thereof. This is commonly called the $dv/dt$ effect or rate effect.

FIG. 1 shows a prior art light activated semiconductor switch device proposed in an effort to obviate the so-called $dv/dt$ effect. In the prior art light activated semiconductor switch device shown in FIG. 1, a bypass current resistor 2 is connected across the cathode gate and the cathode of a light activated PNPN switch 1. However, this proposed arrangement has been defective in that the turn-on sensitivity is low and great power is required for turning on the switch 1. Accordingly, the prior art light activated semiconductor switch device could operate only with very low efficiency and has not been suitable for practical applications considering the electro-optical conversion efficiency of the light source projecting light on the light activated PNPN switch. (For example, the electro-optical conversion efficiency is a few percents at the most when the light source is a light emitting diode.)

With a view to obviate the prior art defects above described, it is a primary object of the present invention to provide an improved light activated semiconductor switch device which can operate with improved tolerance to $dv/dt$ and can be turned on with high sensitivity.

In accordance with the present invention, there is provided a light activated semiconductor switch device comprising a light activated PNPN switch, an impedance element, a switching means and a capacitance element, said impedance element and said switching means being connected in parallel across the cathode gate and the cathode of said light activated PNPN switch, and said switching means being turned on by the current supplied through said capacitance element.

Other objects, features and advantages of the present invention will become apparent from the following detailed description taken in conjunction with the accompanying drawings, in which.

Figure 1:
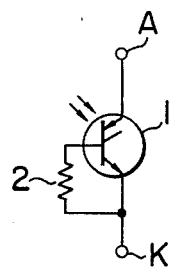
FIG. 1 is an equivalent circuit diagram of a prior art light activated semiconductor switch device in which a resistor is connected between the cathode gate and the cathode of a light activated PNPN switch for improving the tolerance to $dv/dt$ thereof.
Figure 2:
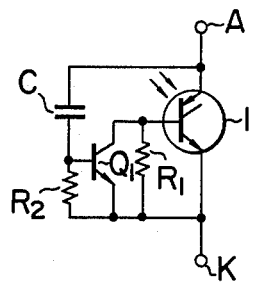
FIG. 2 is an equivalent circuit diagram of an embodiment of the light activated semiconductor switch device according to the present invention.

Referring to an equivalent circuit diagram of FIG. 2, an embodiment of the light activated semiconductor switch device according to the present invention comprises a light activated PNPN switch 1, a bypass current resistor $R_1$ for protecting the light activated PNPN switch 1 against a small $dv/dt$ effect, a bypass current transistor $Q_1$ for protecting the light activated PNPN switch 1 against a large $dv/dt$ effect, a capacitor C for causing transient turn-on of the $dv/dt$ effect protective transistor $Q_1$, and another resistor $R_2$ for discharging the charge stored in the capacitor C and transistor $Q_1$. The so-called $dv/dt$ effect occurs in the prior art structure shown in FIG. 1 when an abrupt voltage variation $dv/dt$ is applied across the anode A and the cathode K of the light activated PNPN switch 1 to cause flow of charging current through the PN junction capacitance $C_J$ an anode gate-cathode gate junction of the light activated PNPN switch 1, and this current acts as cathode gate current which causes erroneous turn-on of the light activated PNPN switch 1. However, in the light activated semiconductor switch device of the present invention shown in FIG. 2, base current is supplied to the $dv/dt$ effect protective transistor $Q_1$ through the capacitor C in response to the application of an abrupt voltage variation $dv/dt$ cross the anode A and the cathode K of the light activated PNPN switch 1, and the transistor $Q_1$ is turned on so as to absorb the charging current supplied to the PN junction capacitance $C_J$. Erroneous turn-on of the light activated PNPN switch 1 can be reliably prevented when the transistor $Q_1$ operates in the saturation region and the collector-emitter saturation voltage of the transistor $Q_1$ is lower than the forward turn-on voltage across the cathode gate and the cathode of the light activated PNPN switch 1. This can be easily attained by selecting the capacitance of the capacitor C to match the PN junction capacitance $C_J$ and suitably selecting $\beta_{Q_1}$ which is the emitter grounded current gain of the transistor $Q_1$ and $V_{CESQ_1}$ which is the collector-emitter saturation voltage of the transistor $Q_1$. More precisely, these values may be selected to satisfy the following relations:

$$(C\frac{dv}{dt} - \frac{V_{BEQ_1}}{R_2})\beta_{Q_1} > C_J\frac{dv}{dt}$$

$$V_{CESQ_1} < V_{GK}(ON)$$

where $V_{BEQ_1}$ is the forward voltage across the base and the emitter of the transistor $Q_1$, and $V_{GK}(ON)$ is the forward turn-on voltage across the cathode gate and the cathode of the light activated PNPN switch 1.

The resistor $R_2$ is required for discharging the charge stored in the capacitor C and transistor $Q_1$. Due to the provision of the resistor $R_2$, the transistor $Q_1$ is cut off when a small $dv/dt$ is applied across the anode A and the cathode K of he light activated PNPN switch 1, that is, when $$C\frac{dv}{dt} < \frac{V_{BEQ_1}}{R_2}.$$

Therefore, the resistor $R_1$ is required to protect the light activated PNPN switch 1 against the $dv/dt$ effect in such a case. However, the function of this resistor $R_1$ differs from that of the resistor 2 in the prior art device shown in FIG. 1 in that it is provided to protect the light activated PNPN switch 1 against a small $dv/dt$. Thus, this resistor $R_1$ may have a high resistance value. The transistor $Q_1$ is naturally in the non-conducting state in the steady state of the switch device, and the gate current is dertermined by the resistance of the resistor $R_1$. Thus, the light activated PNPN switch 1 can be turned on with high sensitivity.

Figure 3:
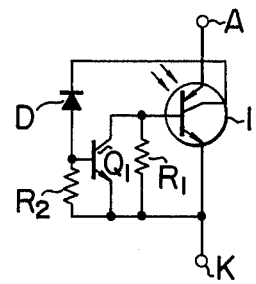
FIGS. 3 to 12 are equivalent circuit diagrams of other embodiments of the present invention.
Figure 6:
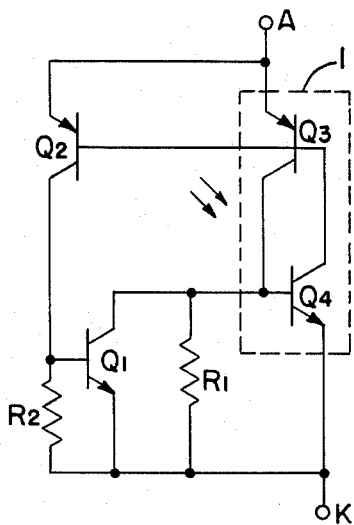

In a modification shown in FIG. 3, the capacitor C is eliminated and a diode D is connected across the anode gate of the light activated PNPN switch 1 and the base of the $dv/dt$ effect protective transistor $Q_1$ to provide a capacitive base current supplying circuit which acts to trigger the transistor $Q_1$ only in the transient state in which the $dv/dt$ is applied across the anode A and the cathode K of the light activated PNPN switch 1. Further, a PNP transistor having a small current gain may be disposed in such a manner that the emitter and base thereof are common-connected with those of the PNP transistor constituting the light activated PNPN switch 1 and the collector thereof is connected with the base of the transistor $Q_1$. Further, a PNP transistor $Q_2$ having a small current gain may be employed instead of a diode D in FIG. 3. In this case, the connection of the PNP transistor $Q_2$ is made as shown in FIG. 6. In FIG. 6, the light activated PNPN switch 1 is composed of a PNP transistor $Q_3$ and an NPN transistor $Q_4$ in which the emitter and base of the PNP transistor $Q_2$ are commonly connected with the emitter and the base of the transistor $Q_3$ while the collector of the PNP transistor $Q_2$ is connected with the base of the NPN transistor $Q_1$.

Figure 7:
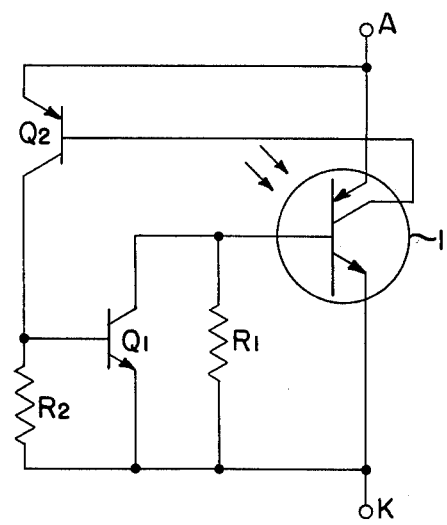

FIG. 7 shows a circuit equivalent to FIG. 6 in which the light activated PNPN switch in FIG. 6 is replaced by a symbol used in FIG. 3. The reason why a transistor ($Q_2$) having a small current again is employed, is to prevent the NPN transistor $Q_1$ from being turned on in the normal state in which the light activated PNPN switch is turned on, and this PNP transistor $Q_2$ turns on the NPN transistor $Q_1$ by mainly using the base-collector junction capacitance only when a transient voltage is applied between the anode A and the cathode K. In this case, the resistor $R_2$ is adapted to have a protective function for preventing the transistor $Q_1$ from conducting in the steady state in addition to the primary function of discharging the stored charge. Further, a capacitance element may be connected in parallel with the resistor $R_1$.

Figure 4:
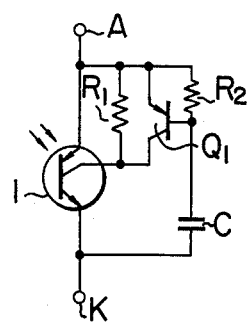
Figure 5:
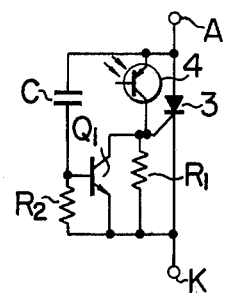

Another embodiment shown in FIG. 4 is based on the same principle as that above disclosed and employs a complementary arrangement. Referring to FIG. 4, a $dv/dt$ effect protective transistor $Q_1$ and an impedance element $R_1$ are connected in parallel across the anode A and the anode gate of a light activated PNPN switch 1, and this $dv/dt$ effect protective transistor $Q_1$ is arranged to be turned on by the current supplied through a capacitance element C. In another embodiment shown in FIG. 5, a light activated PNPN switch is constituted by the combination of a conentional PNPN switch 3 and a photo transistor 4, and a bypass circuit of variable impedance is associated with the light activated PNPN switch. It will be seen from FIG. 5 that, even when the conventional PNPN switch and the light activated element are combined to constitute the light activated PNPN switch, the tolerance to $dv/dt$ can be improved by poviding a bypass circuit of variable impedance similar to that described hereinbefore.

FIG. 6 illustrates an embodiment identical to that illustrated in FIG. 2 with the difference being the substitution of PNP transistor $Q_2$ for capacitor C. PNPN switch 1 is shown by its equivalent circuit consisting of PNP transistor $Q_3$ and PNP transistor $Q_4$.

FIG. 7 illustrates the same embodiment shown in FIG. 6 with the PNPN switch 1 being drawn using standard symbology.

Figure 8:
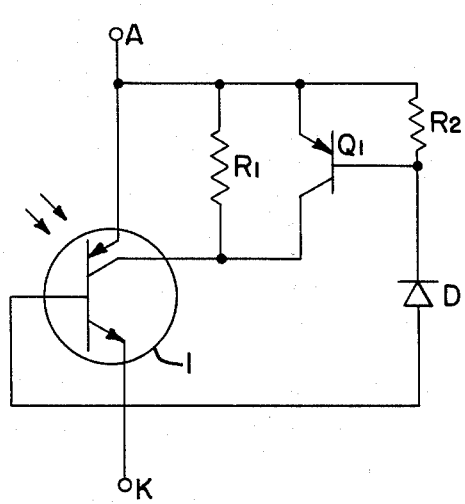

FIG. 8 depicts an embodiment which is complementary to the embodiment illustrated in FIG. 3.

Figure 9:
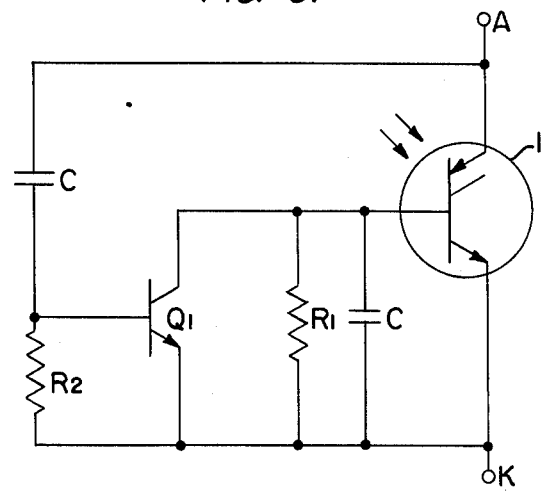
Figure 10:
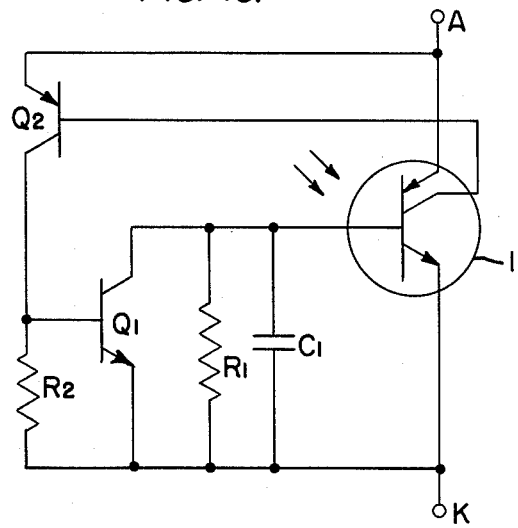

FIGS. 9 and 10 shown the embodiments depicted in FIGS. 2 and 7, respectively, with an additional capacitive element $C_1$ added.

Figure 11:
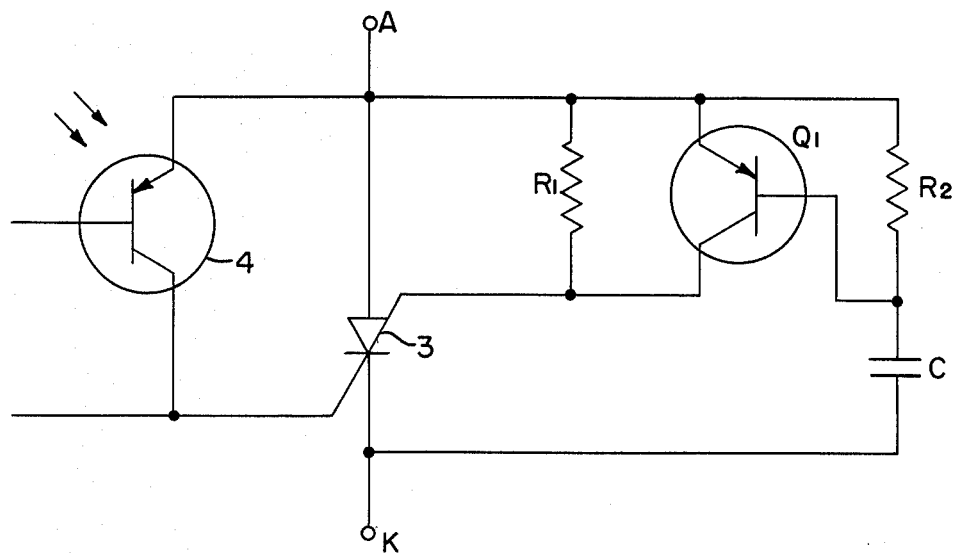
Figure 12:
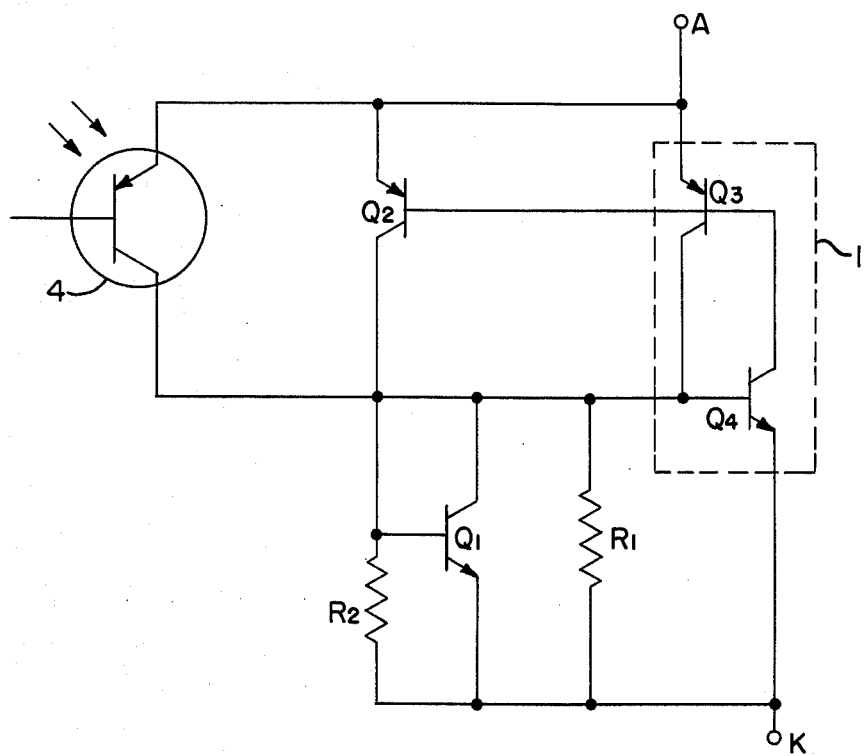

FIGS. 11 and 12 illustrate embodiments identical to those depicted in FIGS. 4 and 6, respectively, with the light activated PNPN switch 1 replaced by a conventional PNPN switch 3 and a phototransistor 4.

It will be understood from the foregoing detailed description that the present invention provides an improved light activated semiconductor switch device which comprises a light activated PNPN switch and which can operate with improved tolerance to $dv/dt$ and high turn-on sensitivity by virtue of the fact that a bypass circuit of variable impedance providing a high impedance in the steady state and a low impedance in response to the application of an abrupt voltage variation $dv/dt$ is connected across the cathode gate and the cathode or across the anode and the anode gate of the light activated PNPN switch.

What is claimed is:

1. A light activated semiconductor switch device comprising a light activated PNPN switch having an anode, a cathode, an anode gate and a cathode gate, an impedance element, a switching means having two terminals in addition to a control terminal for controlling the on-off operation thereof due to a control current supplied thereto and a capacitive element, said impedance element and said two terminals of said switching means being connected in parallel between the cathode gate and the cathode of said light activated PNPN switch, and said control terminal of said switching means being connected through said capacitive element to one of said anode and anode gate of said light activated PNPN switch so as to be turned on by the control current supplied to said control terminal from a current source which is connected to the anode of said light activated PNPN switch.

2. A light activated semiconductor switch device as claimed in claim 1, wherein said switching means is an NPN transistor having a base, emitter and collector.

3. A light activated semiconductor switch device as claimed in claim 2, wherein said capacitive element is a diode, connected between the anode gate of said light activated PNPN switch and the base of said NPN transistor.

4. A light activated semiconductor switch device as claimed in claim 2, wherein said PNPN switch comprises at least a PNP transistor having a base, emitter and collector and wherein said capacitive element is another PNP transistor with a base, emitter and collector and having a small current amplification factor disposed with the emitter and base thereof connected respectively with the emitter and base of the PNP transistor of said PNPN switch and the collector thereof connected with the base of said NPN transistor constituting the switching means.

5. A light activated semiconductor switch device as claimed in claim 2, wherein another capacitance element is connected in parallel with said impedance element.

6. A light activated semiconductor switch device as claimed in claim 1, wherein said PNPN switch is composed of a conventional PNPN switch and a photo transistor.

7. A light activated semiconductor switch device comprising a light activated PNPN switch having an anode, a cathode, a cathode gate and an anode gate, an impedance element, a switching means having two terminals in addition to a control terminal for controlling the on-off operation thereof due to a control current supplied thereto and a capacitive element, said impedance element and said two terminals of said switching means being connected in parallel between the anode and the anode gate of said light activated PNPN switch, and said control terminal of said switching means being connected through said capacitive element to one of said cathode and cathode gate of said light activated PNPN switch so as to be turned on by the control current supplied to said control terminal from a current source which is connected to the anode of said light activated PNPN switch.

8. A light activated semiconductor switch device as claimed in claim 7, wherein said switching means is a PNP transistor.

9. A light activated semiconductor switch device as claimed in claim 8, wherein said capacitive element is a diode, connected between the cathode gate of said light activated PNPN switch and the base of said PNP transistor.

10. A light activated semiconductor switch device as claimed in claim 7, wherein another capacitive element is connected in parallel with said impedance element.

11. A light activated semiconductor switch device as claimed in claim 7, wherein said PNPN switch is composed of a conventional PNPN switch and a photo transistor.

12. A light activated semiconductor switch device comprising a light activated PNPN switch having an anode, an anode gate, a cathode and a cathode gate, an impedance element, a transistor and a capacitive element, said impedance element being connected across a collector and emitter of said transistor, said collector and emitter of said transistor being respectively connected to the cathode gate and the cathode of said light activated PNPN switch, a base of said transistor being connected through said capacitive element to one of the anode and anode gate of said light activated PNPN switch.

13. A light activated semiconductor switch device as claimed in claim 12, wherein said capacitive element is a capacitor.

14. A light activated semiconductor switch device as claimed in claim 12, wherein said capacitive element is a diode.

15. A light activated semiconductor switch device as claimed in claim 12, wherein another capacitive element is connected in parallel with said impedance element.

16. A light activated semiconductor switch device as claimed in claim 12, wherein said light activated PNPN switch comprises a conventional PNPN switch having an anode, a cathode and a cathode gate, and a photo transistor having an emitter and a collector connected between the cathode and cathode gate, respectively, of said conventional PNPN switch.

17. A light activated semiconductor switch device comprising a light activated PNPN switch having an anode, a cathode, a cathode gate and an anode gate, an impedance element, a transistor and a capacitive element, said impedance element being connected across a collector and emitter of said transistor, said emitter and collector being respectively connected to the anode and anode gate of said light activated PNPN switch, a base of said transistor being connected through said cpacitive element to one of the cathode and cathode gate of said light activated PNPN switch.

18. A light activated semiconductor switch device as claimed in claim 17, wherein said capacitive element is a capacitor.

19. A light activated semiconductor switch device as claimed in claim 17, wherein said capacitive element is a diode.

20. A light activated semiconductor switch device comprising a light activated PNPN switch having an anode, a cathode, an anode gate and a cathode gate, an impedance element, a first transistor, a second transistor having a small current amplification factor, said impedance element being connected across a collector and emitter of said first transistor, said collector and emitter of said first transistor being respectively connected to the cathode gate and the cathode of said light activated PNPN switch, an emitter and a base of said second transistor being respectively connected to the anode and the anode gate of said light activated PNPN switch, a collector of said second transistor being connected to the base of said first transistor.

21. A light activated semiconductor switch device as claimed in claim 20, wherein a capacitive element is connected in parallel with said impedance element.

22. A light activated semiconductor switch device as claimed in claim 20, wherein said light activated PNPN switch comprises a conventional PNPN switch having an anode, a cathode and a cathode gate, and a phototransistor having an emitter and a collector connected between the cathode and cathode gate, respectively, of said conventional PNPN switch.

* * * * *